(12) United States Patent
Najafi et al.

(10) Patent No.: US 9,796,586 B2
(45) Date of Patent: Oct. 24, 2017

(54) THREE DIMENSIONAL MICROSTRUCTURES AND FABRICATION PROCESS

(71) Applicant: THE REGENTS OF THE UNIVERSITY OF MICHIGAN, Ann Arbor, MI (US)

(72) Inventors: Khalil Najafi, Ann Arbor, MI (US); Tal Nagourney, Ann Arbor, MI (US); Jae Yoong Cho, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 0 days.

(21) Appl. No.: 14/985,859

(22) Filed: Dec. 31, 2015

(65) Prior Publication Data

US 2016/0194200 A1    Jul. 7, 2016

Related U.S. Application Data

(60) Provisional application No. 62/098,451, filed on Dec. 31, 2014.

(51) Int. Cl.

| | | |
|---|---|---|
| *C03B 23/035* | (2006.01) | |
| *B22D 25/02* | (2006.01) | |
| *B81C 99/00* | (2010.01) | |
| *B22D 23/06* | (2006.01) | |
| *C03B 23/02* | (2006.01) | |
| *C03B 23/03* | (2006.01) | |

(52) U.S. Cl.
CPC .......... *B81C 99/0085* (2013.01); *B22D 23/06* (2013.01); *B22D 25/02* (2013.01); *C03B 23/02* (2013.01); *C03B 23/0302* (2013.01); *C03B 23/0352* (2013.01); *C03B 23/0355* (2013.01); *C03B 23/0357* (2013.01); *B81C 2201/034* (2013.01)

(58) Field of Classification Search
CPC . C03B 23/02–23/0357; B81C 99/0085; B81C 2201/034
See application file for complete search history.

(56) References Cited

U.S. PATENT DOCUMENTS

| | | | |
|---|---|---|---|
| 7,694,531 | B2 | 4/2010 | Eklund et al. |
| 8,151,600 | B2 | 4/2012 | Eklund et al. |
| 8,567,247 | B2 | 10/2013 | Shkel et al. |
| 8,631,702 | B2 | 1/2014 | Horning et al. |

(Continued)

OTHER PUBLICATIONS

J. Cho et al "High-Q Fused Silica Birdbath and Hemispherical 3-D Resonators Made by Blow Torch Molding", IEEE (2013).

*Primary Examiner* — Lisa Herring
(74) *Attorney, Agent, or Firm* — Harness, Dickey & Pierce, P.L.C.

(57) ABSTRACT

A method for fabricating three-dimensional microstructures is presented. The method includes: disposing a substantially planar reflow material between two molds; heating the reflow material while the reflow material is disposed between the two molds; and reflowing the reflow material towards the bottom surface of one of the molds by creating a pressure gradient across the reflow material. At least one of molds includes geometrics features that help to shape the reflow material and thereby form a complex three-dimensional microstructure.

17 Claims, 24 Drawing Sheets

(56) References Cited

U.S. PATENT DOCUMENTS

| | | | |
|---|---|---|---|
| 2005/0257568 A1* | 11/2005 | Taft | C03B 19/02 |
| | | | 65/102 |
| 2010/0000259 A1* | 1/2010 | Ukrainczyk | C03B 23/0235 |
| | | | 65/104 |
| 2012/0144866 A1* | 6/2012 | Liu | C03B 23/0302 |
| | | | 65/104 |
| 2013/0081428 A1* | 4/2013 | Liu | C03B 40/00 |
| | | | 65/106 |
| 2013/0160578 A1 | 6/2013 | Najafi et al. | |

* cited by examiner

P_cavity (inside bottom cavity)

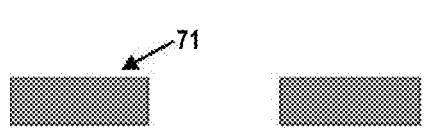
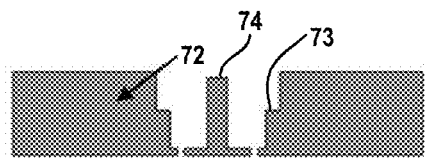
FIG. 7A　　　　　　　　FIG. 7B
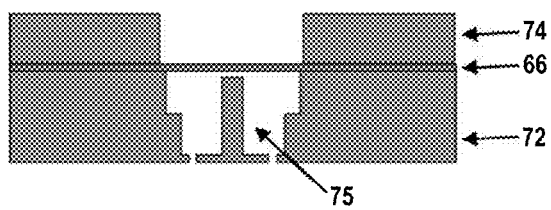
FIG. 7C
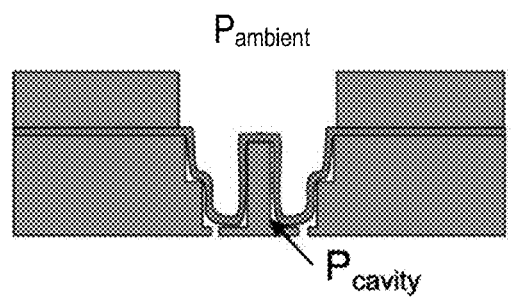
FIG. 7D
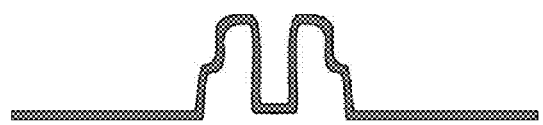
FIG. 7E

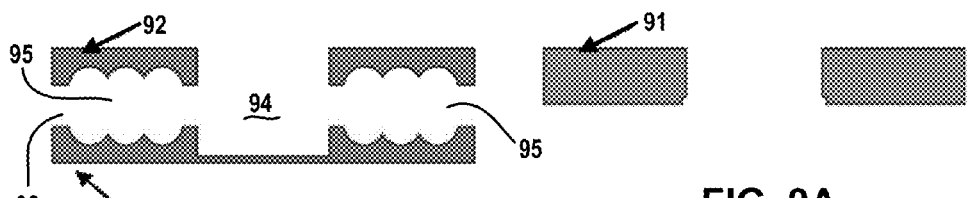
FIG. 9A
FIG. 9B
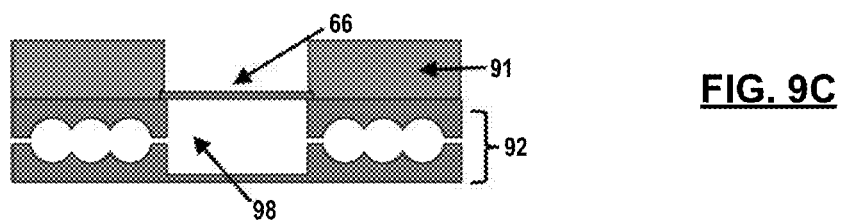
FIG. 9C
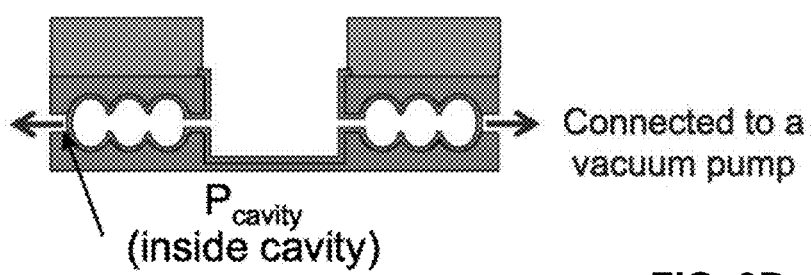
FIG. 9D
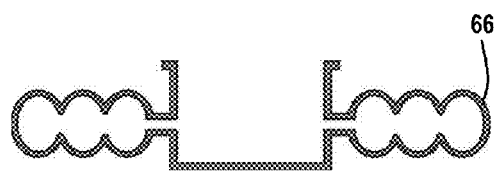
FIG. 9E

THREE DIMENSIONAL MICROSTRUCTURES AND FABRICATION PROCESS

CROSS-REFERENCE TO RELATED APPLICATIONS

This application claims the benefit of U.S. Provisional Application No. 62/098,451, filed on Dec. 31, 2014. The entire disclosure of the above application is incorporated herein by reference.

GOVERNMENT CLAUSE

This invention was made with government support under W31P4Q-11-1-0002 awarded by the U.S. Army/Army Materiel Command. The Government has certain rights in this invention.

FIELD

The present disclosure relates to three dimensional microstructures and fabrication processes for the same.

BACKGROUND

Recent advances in micro-electromechanical system (MEMS) technologies resulted in the successful commercialization of high-performance sensors and actuators in a variety of areas such as motion sensing, wireless communication, energy harvesting, and healthcare. There is a growing need for MEMS sensors with better resolution, lower noise, better bias stability, and larger dynamic range as well as a MEMS actuator with larger actuation range and better long term stability.

The performance of MEMS sensors and actuators are limited by their materials and structures. Most MEMS devices are made of silicon, metals, or polymers, which have low mechanical and optical quality factors (Q). Because of their low Q, they have large noise and small actuation range. One of the common sensors that require very high Q is a vibratory rate-integrating gyroscope (RIG). Compared to the conventional gyroscope, called the rate gyroscope (RG), the RIG offers several advantages including direct angular readout, large bandwidth, and large full-scale range. The accuracy of the RIG is roughly inversely proportional to its decay time constant ($\tau$). The $\tau$ of silicon is limited by thermoelastic damping (TED) mechanism to less than 100 seconds, comparing to several hundred seconds for an ultra-high-Q material such as fused silica (FS). For this reason, it is desirable to fabricate the RIG using such materials. Most MEMS devices have two dimensional (2D) geometries because of limitations in existing microfabrication technologies. Sensors with these geometries tend to have worse performance under external vibrations, shocks, and temperature drifts than sensors with three dimensional (3D) geometries.

The hemispherical resonator gyroscope (HRG), developed by Delco in 1980s, is the gyroscope with the state-of-art accuracy, sufficient to guide airplanes and space satellites. The HRG is made with fused silica, which is a material with an extremely high Q due to very low TED. The HRG has a shape of a wineglass. The advantage of the wineglass geometry is that due to the symmetry of its structure, the vibrating energy does not leak through the anchor. Because of this, the sensor has a very high Q. Another advantage of the wineglass geometry is that, due its high rigidity in tilting and vertical directions, it has good vibration insensitivity.

The problem of the HRG, however, is that because fused silica is very difficult to machine using the conventional micromachining technique, the wineglass resonator is made using manual grinding and polishing techniques and assembled to the electrodes. This manufacturing process is expensive, slow, and inaccurate for making micro-scale sensors.

Thus, there remains a need for micro fabrication techniques to fabricate 3D micro sensors with reflowable materials with good accuracy and extremely good surface smoothness (i.e., RMS roughness ($R_a$)<1 nm). This section provides background information related to the present disclosure which is not necessarily prior art.

SUMMARY

This section provides a general summary of the disclosure, and is not a comprehensive disclosure of its full scope or all of its features.

In one aspect, a method is presented for fabricating three-dimensional microstructures. The method includes: disposing a substantially planar reflow material on a first mold having a recess formed therein, wherein the recess in the first mold defines a bottom surface and at least one side surface, and the at least one side surface includes a protrusion protruding into the recess; heating the reflow material while the reflow material is disposed on the first mold; and reflowing the reflow material towards the bottom surface of the first mold by creating a pressure gradient across the reflow material, whereby the protrusion in the at least one side surface helps to shape the reflow material and thereby form a three-dimensional microstructure.

In another aspect, the method includes: micromachining a first mold with a recess formed therein; micromachining a second mold with a recess formed therein, the recess defining a bottom surface and at least one side surface; disposing a substantially planar reflow material between the first mold and the second mold, such that the recess in the first mold faces the recess in the second mold and thereby forms a cavity; heating the reflow material while the reflow material is disposed between the first mold and the second mold; and creating a pressure gradient across the reflow material to reflow the reflow material towards the bottom surface of the second mold, wherein the pressure gradient is controlled independently from the heating of the reflow material.

In yet another aspect, the method includes: affixing a solid member to a first mold having a recess formed therein, wherein the solid member is disposed in the recess and the first mold defines a bottom surface and at least one side surface; disposing a substantially planar reflow material on the first mold, wherein the reflow material covers the recess and the solid member disposed in the recess; heating the reflow material while the reflow material is disposed on the first mold; and creating a pressure gradient across the reflow material to reflow the reflow material towards and in contact with the solid member, whereby the reflow material bonds with the solid member to form a unitary three-dimensional microstructure.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIGS. 7A-7E are cross-sectional views illustrating an example fabrication method in which the substrate flows toward the bottom mold

FIG. 9A-9E are cross-sectional views illustrating an example method for fabricating microstructures with hollow shells by reflow molding in lateral directions;

Corresponding reference numerals indicate corresponding parts throughout the several views of the drawings.

DETAILED DESCRIPTION

Example embodiments will now be described more fully with reference to the accompanying drawings.

Unlike most MEMS devices, the axisymmetric shells in this disclosure are tall, complex-shaped structures. These shapes are difficult to create using conventional lithography-based MEMS fabrication processes. These structures can be used, for example as resonators for navigation-grade vibratory rate-integrating gyroscopes (RIGs) due to: 1) very high Q due to excellent structural symmetry and low anchor loss and 2) a high angular gain, due to large momentum perpendicular to the yaw axis. While reference is made throughout this disclosure to gyroscopes, it is understood that the fabrication techniques described herein may be used to construct microstructures for use in other types of sensors, including RF filters, RF resonators, RF switches, optical sensors, optical connectors, chemical sensors, gas sensors, biological sensors and actuators, as well as other types of applications.

Figure 1A:
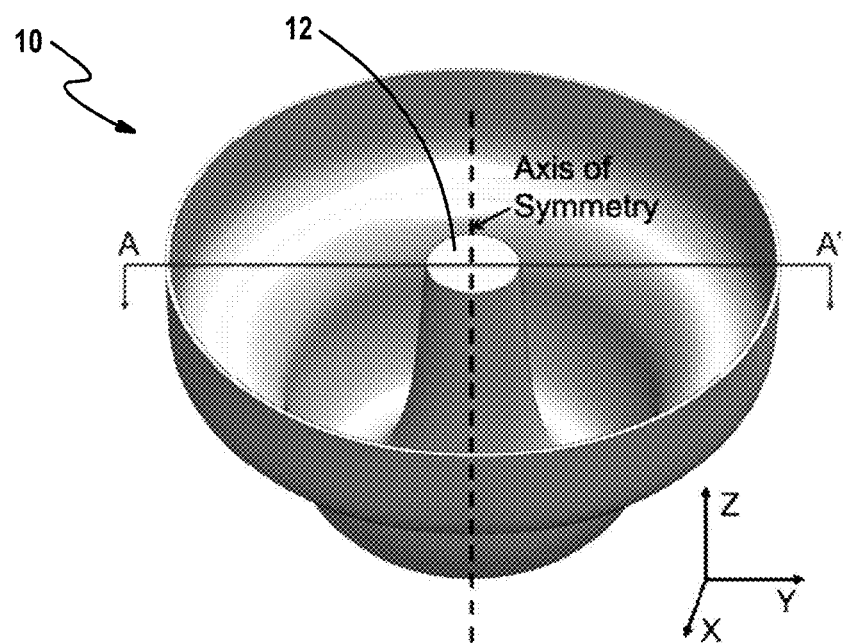
FIGS. 1A and 1B are a perspective view and a cross-sectional side view, respectively, of an example resonator.
Figure 1B:
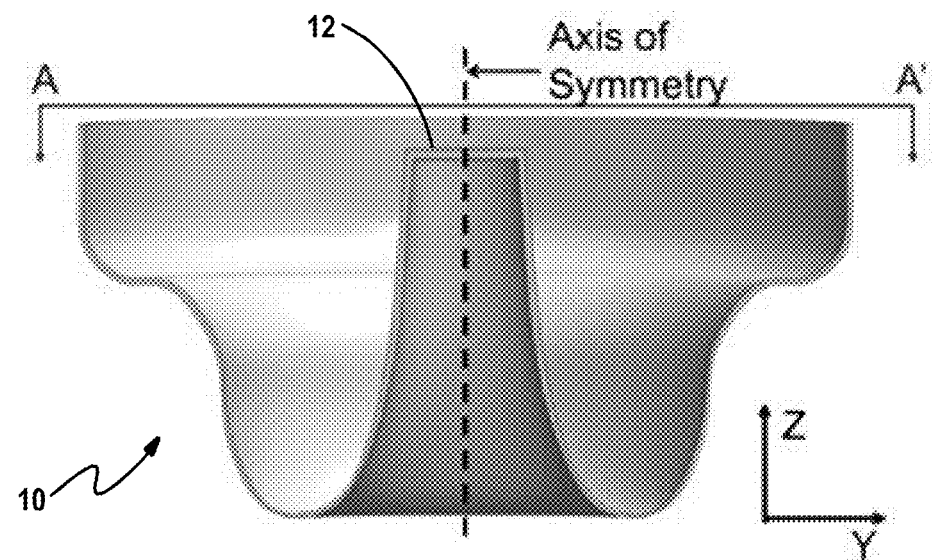
Figure 2A:
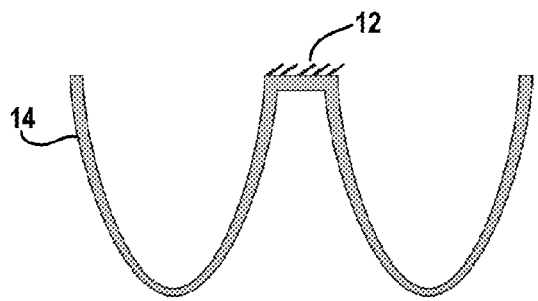
FIGS. 2A-2H are cross-sectional views of example shapes for microstructures which may be fabricated in accordance with this disclosure.
Figure 2B:
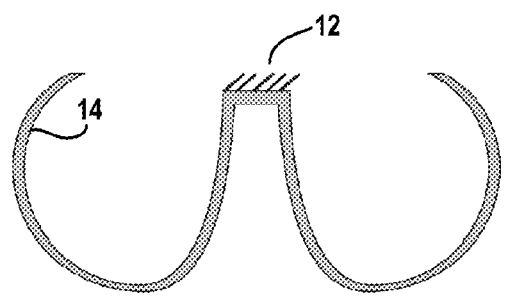
Figure 2C:
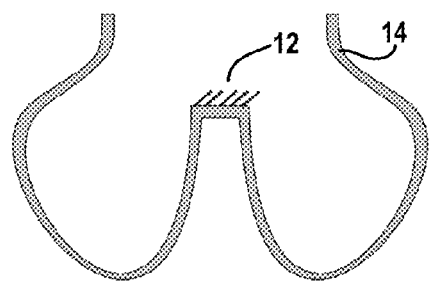
Figure 2D:
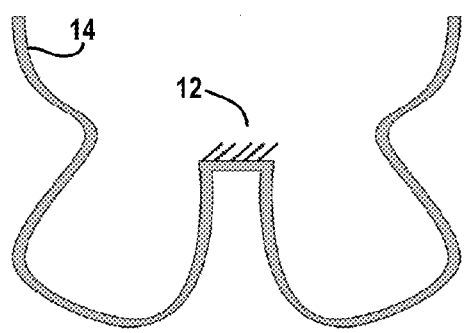
Figure 2E:
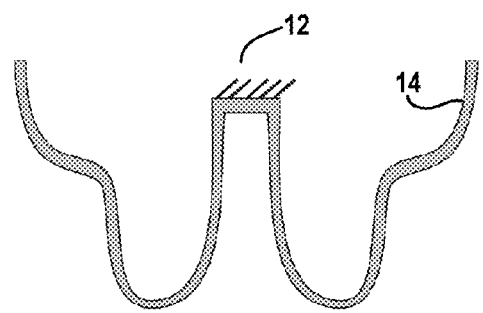
Figure 2F:
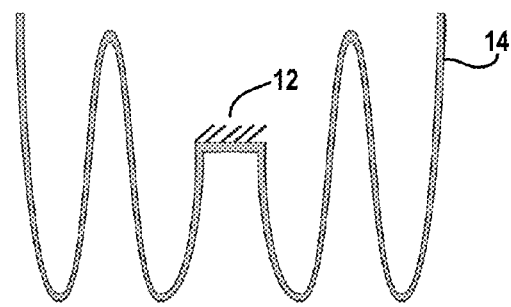
Figure 2G:
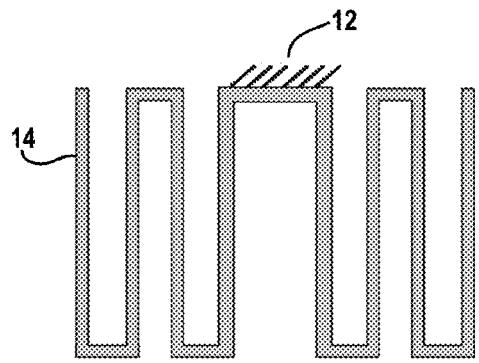
Figure 2H:
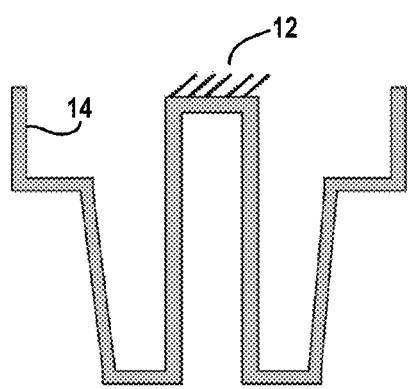
Figure 3A:
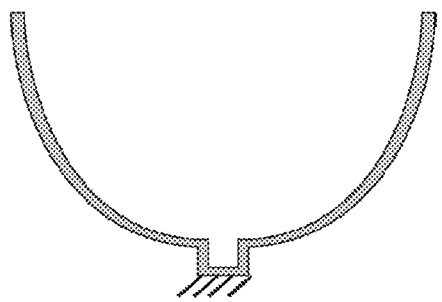
FIG. 3A-3G are cross-sectional views of more example shapes for microstructures with different types of anchor regions.
Figure 3B:
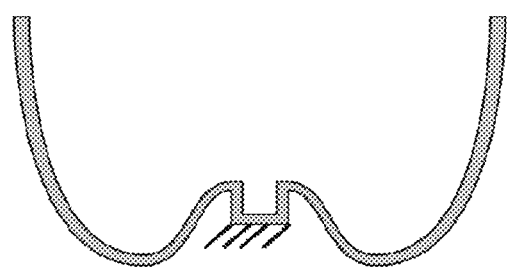
Figure 3C:
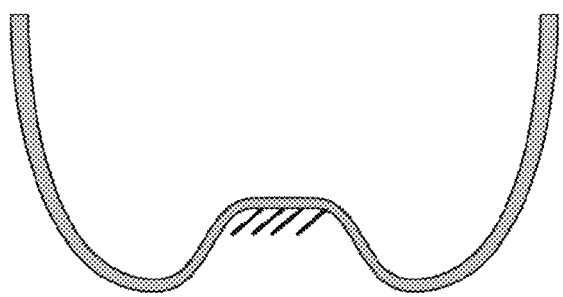
Figure 3D:
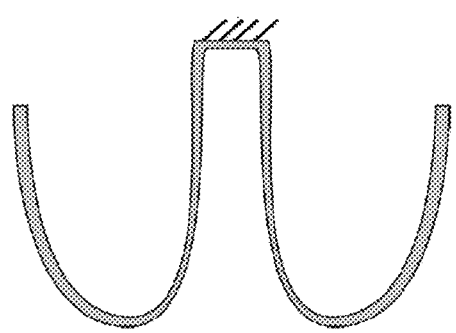
Figure 3E:
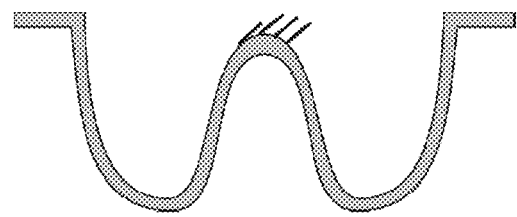
Figure 3F:
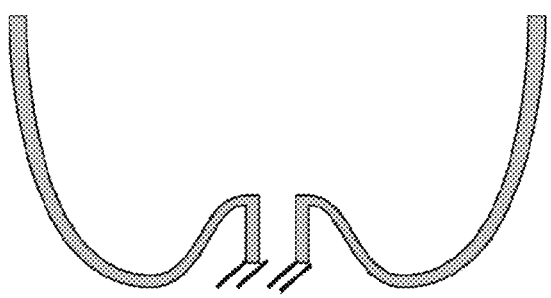
Figure 3G:
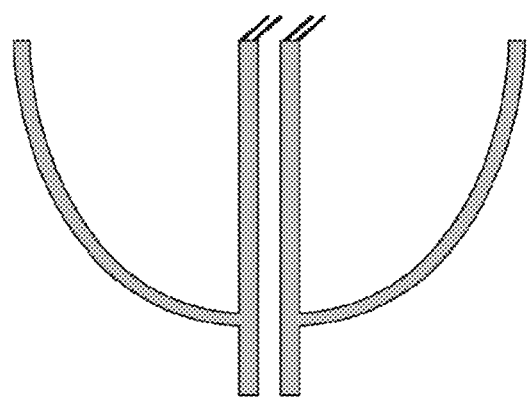
Figure 4A:
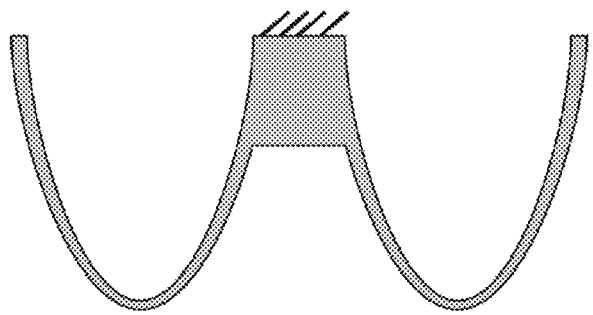
FIGS. 4A-4I are cross-sectional views of microstructures having different types of solid regions.
Figure 4B:
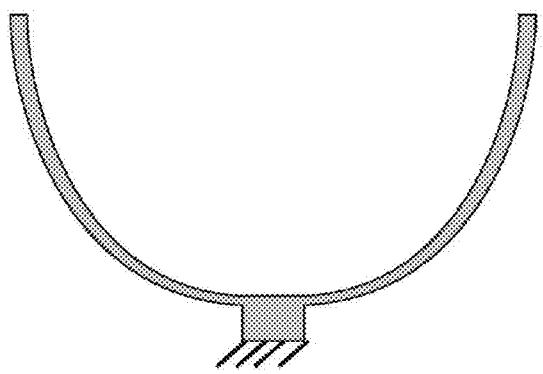
Figure 4C:
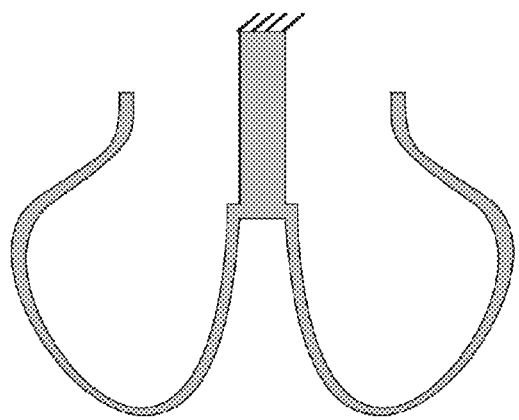
Figure 4D:
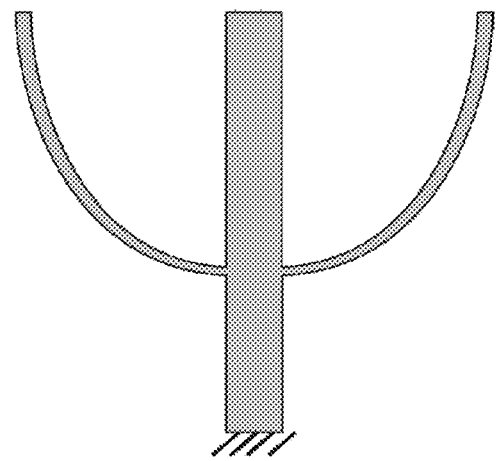
Figure 4E:
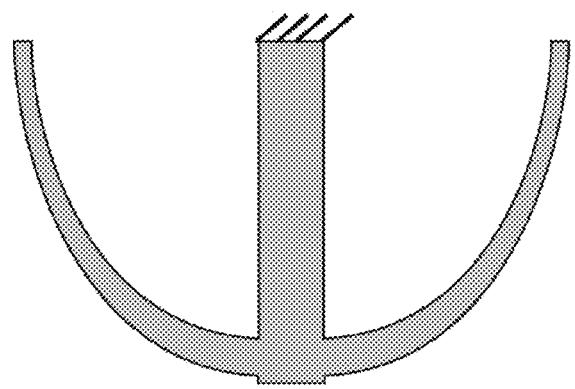
Figure 4F:
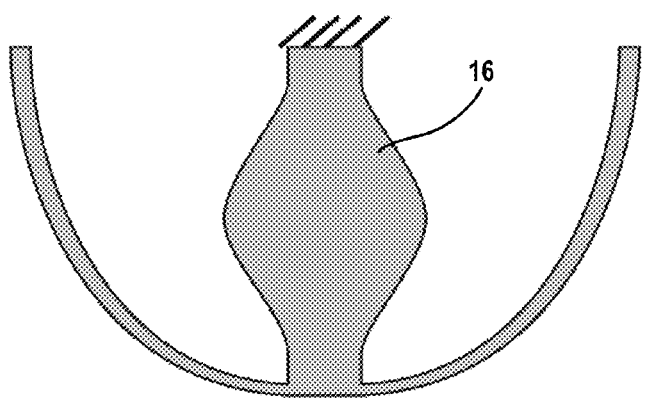
Figure 4G:
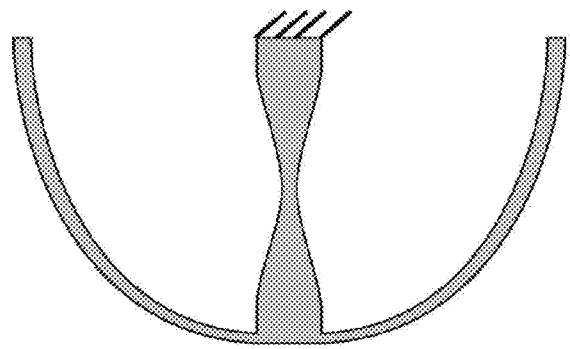
Figure 4H:
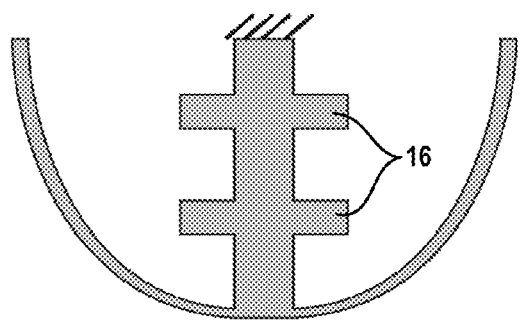
Figure 4I:
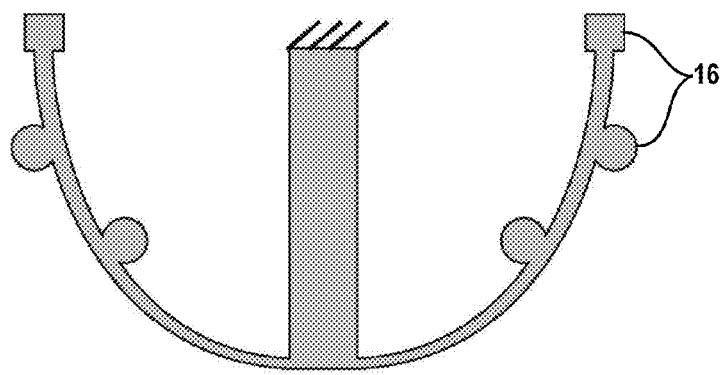
Figure 5A:
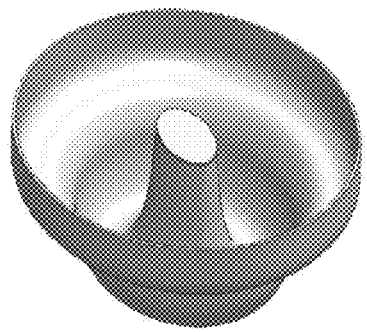
FIGS. 5A-5D are perspective views of example resonators with non-axisymmetric shapes.
Figure 5B:
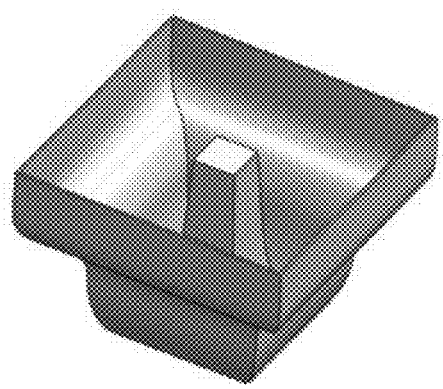
Figure 5C:
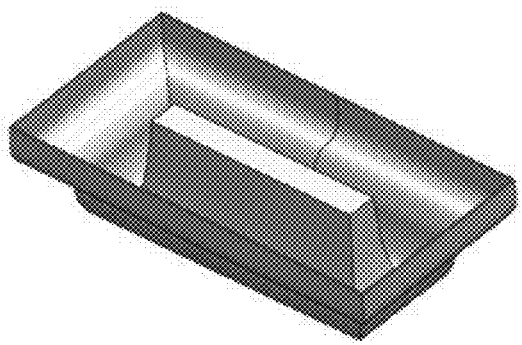
Figure 5D:
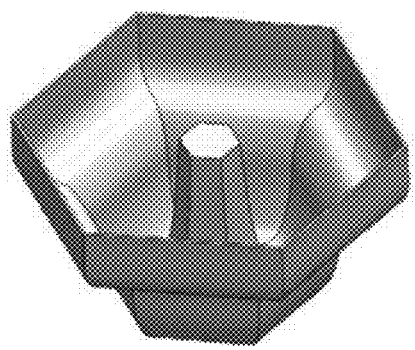

FIGS. 1A and 1B depict an example resonator 10 constructed using the microfabrication techniques described herein and referred to as a bell resonator. In an example embodiment, the resonator 10 has a length, width, and height from several micrometers (μm) to several centimeters (cm). During use, a part of the innermost region 12 (i.e., closest to the symmetry axis) of the resonator 10 is anchored to a rigid support. The cross-section of the shell has a complex polynomial curve from the anchor point 12 to the rim 14. This complex shell helps the resonators to retain high stiffness in the vertical directions (parallel to Z-axis), low stiffness in the lateral directions (parallel to XY plane), low anchor loss, low thermoelastic damping, high effective mass, and high angular gain. Other shapes for the resonator 10 are contemplated by this disclosure including but not limited to those shown in FIGS. 5A-5D.

FIGS. 2A-2H depict additional three-dimensional microstructures which can be fabricated using the microfabrication techniques described below. In these examples, the anchor region 12 is located at the center of the microstructure with curved or straight walls extending at arbitrary angles from the anchor region 12 to a rim 14 located at the periphery of the structure. FIGS. 3A-3G depict three-dimensional microstructure with anchor regions having varying shapes; whereas, FIGS. 4A-4I depict three-dimensional microstructures with different solid regions 16. These different shapes are understood to be illustrative and not limiting of the shapes that may be formed using the microfabrication techniques described below FIGS. 6A-6D illustrates an example technique for fabricating three-dimensional microstructures in accordance with this disclosure. First, the top mold 51 and the bottom mold 61 are micromachined using a variety of micromachining processes such as etching, milling, laser ablation, sand blasting, and electro-discharge machining. In this example, the top mold 51 includes a recess 52 formed therein, such that the recess 52 defines a bottom surface 53 and at least one side surface 54. Depending on the shape of the recess, there may be one or more side surfaces 54. In any case, the side surface(s) 54 further include a protrusion 55 protruding into the recess 52 of the top mold 51. In this example, the recess 52 has a cylindrical shape with one step formed on the side surface and serving as the protrusion 55. The top mold 51 may further include a pillar 56 extending inward from the bottom surface 53 of the recess 52.

The bottom mold 61 also includes a recess 62 formed therein, such that the recess defines a bottom surface 63 and at least one side surface 64. One or more through holes 65 may be formed in the bottom surface of the top mold 51 and/or the bottom surface of the bottom mold 61. The one or more through holes 65 may be fluidly coupled to a pressure source (e.g., a vacuum).

Figure 6A:
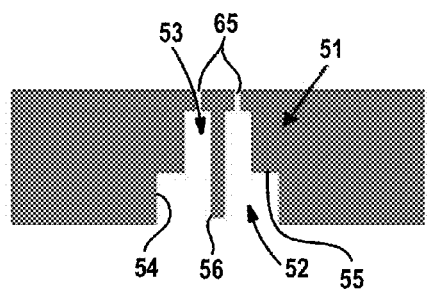
FIGS. 6A-6E are cross-sectional views illustrating an example fabrication method in which the substrate flows away from the bottom mold.
Figure 6B:
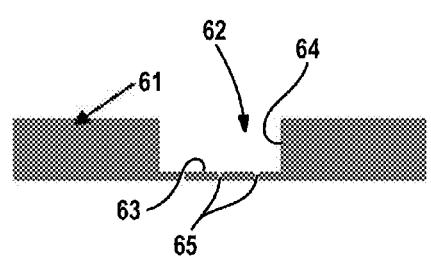
Figure 6C:
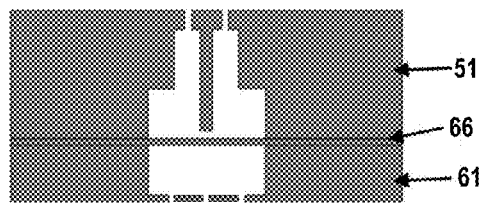

A molding substrate 66 is disposed between the top mold 51 and the bottom mold 61 as shown in FIG. 6C. More specifically, the recess 52 in the top mold 51 faces the recess 62 in the bottom mold 61 and thereby forms a cavity in the molds. The molding substrate 66 is substantially planar and divides the cavity into two (i.e., top cavity and bottom cavity) when placed between the two molds. The molding substrate 66 may be clamped onto the bottom mold 61 by weight, air pressure, or bonding. In some embodiments, the molding substrate 66 is a reflow material such as fused silica, sapphire, ruby, silicon, and glass. Other types of reflow materials may also be suitable for use. Some suitable materials that may be used include conductive materials and non-conductive high-Q materials that have a thin layer of conductive material coated on the surface. The shape of the molding substrate 66 is not limited to planar. The substrate may be, for example curved or planar but with different topologies defined therein by etching, milling, etc.

Next, the molding substrate 66 is heated while the substrate 66 is disposed between the molds 51, 61. The reflow molding occurs either above the glass transition temperature ($T_g$) for non-crystalline material or above the melting point ($T_M$) of the source material (i.e., substrate). In an example embodiment, the temperature is controlled through the use of a blowtorch. It is envisioned that the temperature of the reflow material can be controlled using a wide variety of methods including combustion heating, radiation heating, convection heating, conduction heating, and induction heating.

A pressure gradient is then created across the substrate 66 to reflow the reflow material towards the top mold 51. In this example, the pressure of the cavity below the substrate ($P_{cavity}$) is made higher than the ambient pressure ($P_{ambient}$) outside of the cavity formed within the molds 51, 61. The pressure gradient values depend on the thickness of the substrate 66 and the viscosity of the substrate during molding. In the case of a flat fused silica substrate with a thickness of 100 μm at around 1600° C., a pressure gradient across the substrate of 200 Torr is sufficient. The pressure gradient drives the substrate 66 away from the cavity and towards the stepped surface and the pillar formed in the top mold 51 as seen in FIG. 6D.

The shape of the sidewall of the reflown substrate is similar to (i.e., mimics) the shape of the top mold 51. The reflow material may touch the mold 51 when the temperature of the mold is equal to the temperature of the reflown material. However, when the temperature of the mold is kept lower than the reflown material, the substrate 66 cools down below $T_g$ or $T_M$ while it is reflown on the mold 51 due to transient heat transfer from the reflown material to the mold 51. In this case, the substrate 66 will only touch the corners of the mold 51 or will not touch the mold 51 at all. Consequently, the roughness of the surface of the reflown substrate is very low (few Angstroms), because it is only affected by the surface tension of the heated material. The smooth surface of the microstructure is crucial for achieving high mechanical and optical Q, because it causes very low energy loss on the surface of the microstructure. In this process, the temperature of the molding substrate 66 is usually, but not limited to be, higher than the temperatures of the molds 51, 61. Because of this temperature difference, the substrate is transiently cooled down by convection and conduction heat transfer phenomena as it approaches the molds within a certain distance. The substrate is cooled down below $T_M$ or $T_g$, and the substrate does not deform further beyond that point. This is the reason why the substrate minimally touches the molds or does not touch the molds at all and allow the substrate to obtain very smooth surface (e.g. <1 nm), which is crucial for achieving high Q. Using conventional blow molding, casting, or injection molding techniques, the temperature of the molds are either the same or higher than the temperature of the substrate. The shape of molded parts using these techniques is obviously an exact negative of the mold. The process disclosed here is a unique process that uses inexpensive molds with high surface roughness (e.g. >100 nm) yet create extremely smooth molded parts (e.g. <1 nm).

Figure 6D:
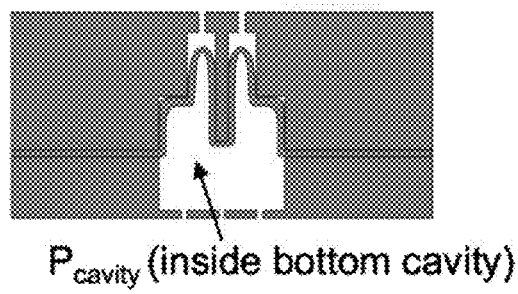
Figure 6E:
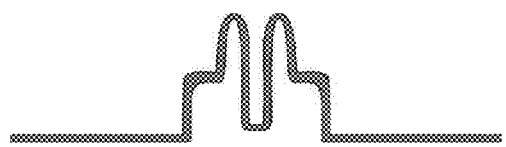

Lastly, the reflown substrate 66 is detached from the mold as seen in FIG. 6D. This fabrication process allows for a wide selection of mold materials. For example, a material with large mismatch in the coefficient of thermal expansion (CTE) to the reflowed material can be allowed, because the fabrication process does not require permanent bonding between these materials. A mold material with a lower melting temperature than the reflowed material can also be used because of short processing time (e.g., <10 s). The process is compatible with batch fabrication, and the mold can be used indefinitely.

FIGS. 7A-7E illustrate another example technique for fabricating three-dimensional microstructures. In this example, the bottom mold 72 has a side surface with a protrusion 73 protruding into the recess and a pillar 74 extending upward from the bottom surface of the bottom mold 72; whereas, the top mold 71 merely includes a recess. The process is similar to the process steps described in FIGS. 6A-6E, except that the pressure in the lower cavity 75 ($P_{cavity}$) is kept lower than the ambient pressure ($P_{ambient}$). As a result, the substrate 66 reflows downward towards the bottom mold as shown in FIG. 7D. The value of the pressure gradient in this process is similar to the process in FIG. 6. Unlike the process shown in FIGS. 6A-6E, in the process shown in FIGS. 7A-7E, molding can be done using only the bottom mold 72. This is because the molding substrate 66 can be clamped on the bottom mold if $P_{cavity}$ is kept lower than $P_{ambient}$. Thus, in some embodiments, there is no need to clamp the substrate 66 using a top mold.

Microstructures can be created with features having different heights by applying multiple pressure gradients across the molding substrate. FIGS. 8A-8D illustrates an example method for fabricating a microstructure with features having different heights. In this example, the recess in the bottom mold 82 is partitioned into two or more cavities 83. Specifically, a middle pillar 84 is disposed in the center of the bottom mold and surrounded by a concentric ring 85, thereby partitioning the recess into two different cavities 83. Through holes are machined into the bottom surface of the bottom mold 82 such that each of the cavities can be fluidly coupled to a pressure source. In this example, the two inner cavities are coupled to one pressure source ($P_{cavity1}$) and the two outer cavities are coupled to another pressure source ($P_{cavity2}$), where $P_{cavity1} > P_{cavity2}$.

Structures having a small thermal mass and high thermal resistance can be heated to a higher temperature than structures having a large thermal mass and low thermal resistance under the same amount of applied heat. For instance, during reflow molding, in the bottom mold 82 in FIG. 8B, the temperatures of the pillar 84 and the ring 85 (seen as the leftmost and rightmost pillars) become hotter than the boundary regions. This is because the pillar 84 and the ring 85 are narrow and tall so they have smaller thermal mass than the boundary. In addition, the pillar 84 and the ring 85 are surrounded by voids from both sides, so they are more thermally insulated than the boundary. The thermal mass and the thermal resistivity of the pillars 84 and the ring 85 are controlled with their width and height as well as the width and height of the recesses 83. Molds having regions with lower thermal mass and higher thermal resistance than the boundary can be utilized to reflow more axisymmetric shells than the molds that do not include those regions. For example, the mold 82 in FIG. 8b can create more axisymmetric shells than mold 72 in FIG. 7C. This is because the temperatures of the ring 85 in mold 82 can become more axisymmetric than mold 72 even when the heat source (e.g. blowtorch) and the mold are misaligned and the mold is heated asymmetrically. Misalignment between a heat source and a mold is inevitable; however, the extra recess defined on the other side of ring 85 help the ring 85 to have more uniform temperature. In addition, the ring 85 induces lower thermal stress and smaller thermal deformation to the molding substrate 66 than the mold 72 in FIG. 7C, because it is heated closer to the temperature of the substrate 66. The embodiment of the molds for reflowing shells with high symmetry described here is not limited to particular shape described in FIG. 8B.

Figures 8A, 8B:
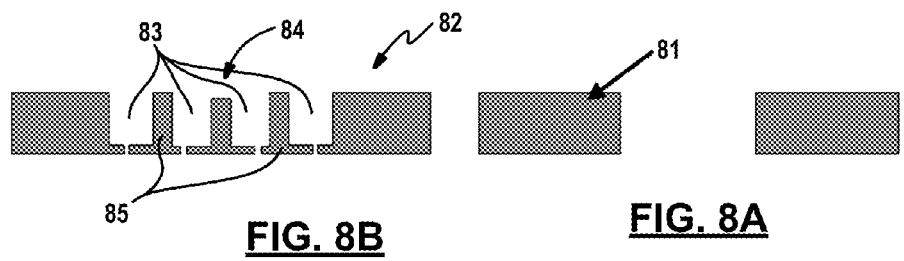
FIG. 8A-8E are cross-sectional views illustrating an example method for fabricating microstructures with features having different heights.
Figure 8C:
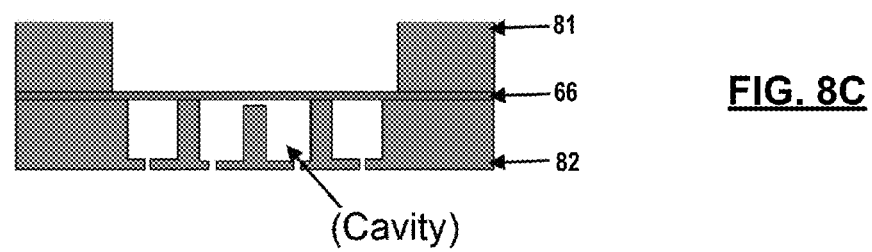
Figure 8D:
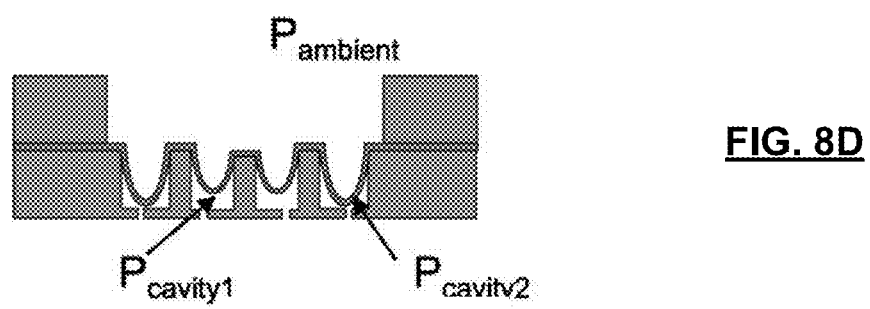
Figure 8E:
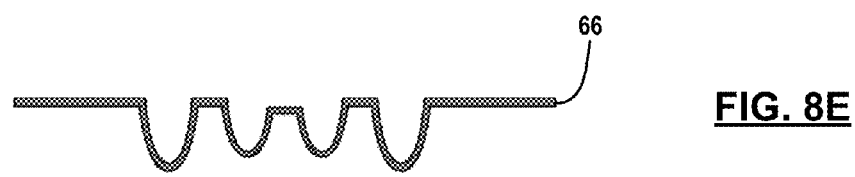

With the molding substrate 66 disposed between the two molds, the reflow material is heated above its melting temperature. Pressure gradients are then created across the molding substrate 66. In this example, the ambient pressure ($P_{ambient}$) is higher than $P_{cavity1}$ or $P_{cavity2}$. Because the pressure gradient between $P_{ambient}$ and $P_{cavity2}$ is larger than the pressure gradient between the $P_{ambient}$ and $P_{cavity1}$, the molding substrate 66 reflows deeper into the outer cavities than the inner cavities as seen in FIG. 8D. Lastly, the reflown substrate 66 is detached from the molds as seen in FIG. 8E. Except for the differences described above, this fabrication method is the same as that described in relation to FIGS. 6A-6E.

FIGS. 9A-9D depict the process steps for fabricating microstructures with hollow shells by reflow molding in the lateral directions. In a similar manner, the bottom mold 92 includes a recess 94 formed therein, such that the recess 94 defines a bottom surface and at least one side surface. The bottom mold 92 further includes one or more pockets 95 formed in the at least one side surface as seen in FIG. 9B. In one example, the pockets 95 are formed by two halves of the bottom mold 92. The pockets 95 may be fluidly coupled via through holes 96 to a pressure source (e.g. a vacuum).

With reference FIG. 9C, the molding substrate disposed between the top mold and bottom mold and the reflow material is heated above its melting temperature. Pressure gradients are then created across the molding substrate 66. The pressure inside the cavity 98 is first made smaller than the ambient pressure outside the cavity, such that the molding substrate 66 flow down towards the bottom surface of the bottom mold 92. The pressure inside the cavity 98 is then made larger than the ambient pressure so that the molding substrate 66 reflows laterally into the pockets 95. In FIG. 9D, the molded substrate 66 is detached from the mold. The molding angle can be controlled with the angle of the patterns defined on the bottom molds. This process allows the creation of hollow, solid, and/or a combination of both types of geometries. Except for the differences described above, this fabrication method is the same as that described in relation to FIGS. 6A-6E.

Figure 10A:
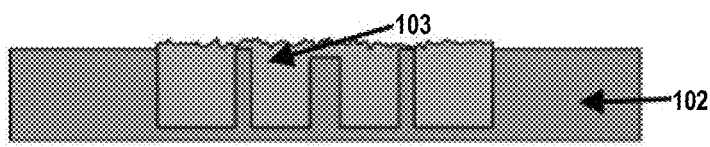
FIGS. 10A-10C are cross-sectional views illustrating a molding process for frit of thermally reflowable material.
Figure 10B:
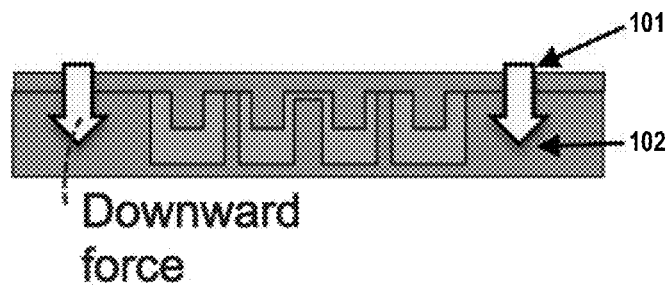
Figure 10C:

FIGS. 10A-10C show the process steps for a method that creates a structure consisting of regions with different thicknesses by molding powder, frit or small pieces of one or more kinds of material. Top and bottom molds 101, 102 are machined in the manner described above. A frit or small pieces of a thermally reflowable material 103 is disposed inside the bottom mold 102 as seen in FIG. 10A. The frit 103 is then covered by the top mold 101. While heating the frit above $T_M$ or $T_G$, a downward force is applied to the top mold 101 to press the material into the shape defined by the top and bottom molds as seen in FIG. 10B. In FIG. 10C, the molded piece 105 is detached from the molds.

Figure 11A:
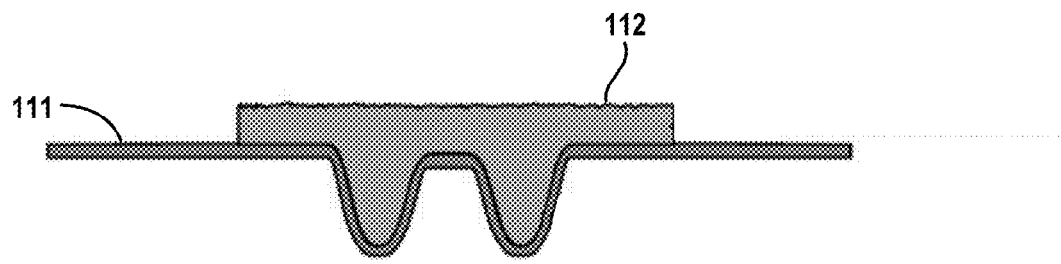
FIGS. 11A and 11B are cross-sectional views illustrating a reflow molding process that uses a formerly blown shell as a mold for the second piece.
Figure 11B:
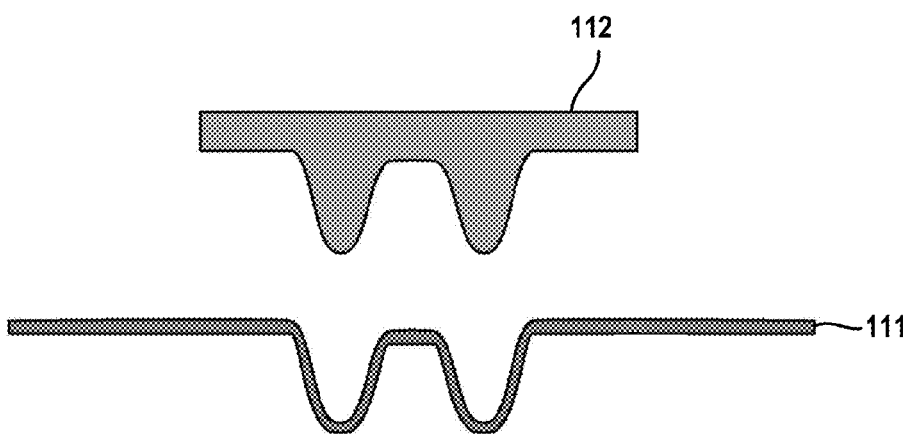

FIGS. 11A-11C show the steps of a sequential molding process that uses a formerly reflown piece as a mold for a second molded piece. First, a mold 111 is prepared from a first material, for example using the reflow molding technique described in FIG. 6. A thin layer of anti-stiction material could be applied on top of the first mold 111. Frit of a second material 112 is applied on the recess of the first mold 111 as seen in FIG. 11A. The frit or powder reflows above its $T_g$ or $T_M$ onto the first mold 111. After cooling, the mold 111 is separated from the second material 112 as seen in FIG. 11C. This process allows the molding of solid parts with ultra-smooth surface quality using a starting mold with high degree of roughness.

Figures 12A, 12B:
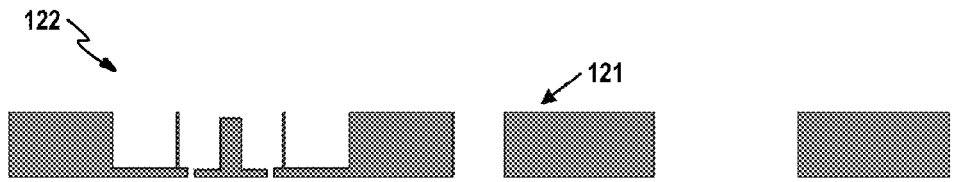
FIGS. 12A-12F are cross-sectional views illustrating process steps to create a microstructure bonded with solid pieces.
Figure 12C:
Figure 12D:
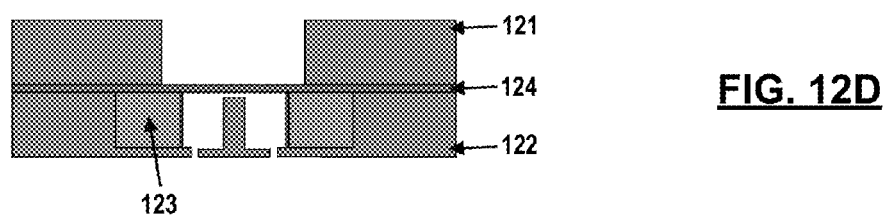
Figure 12E:
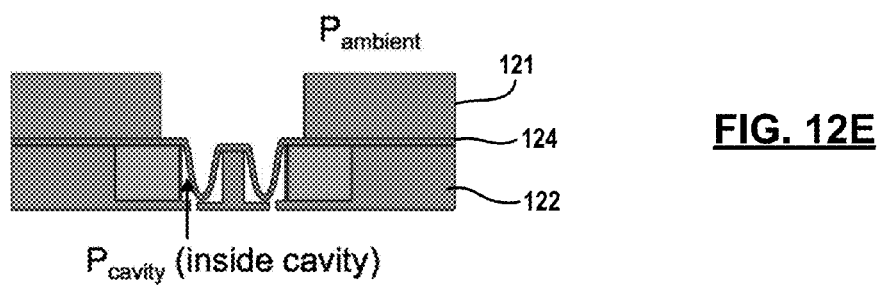
Figure 12F:

FIGS. 12A-12F show the process steps to create a hollow microstructure bonded with solid pieces by simultaneously reflowing a substrate and welding the substrate to solid pieces that are molded previously. In FIGS. 12A and 12B, the top and bottom molds 121, 122 are machined, respectively, in the manner described above. Frit of a reflowable material 123 is applied into the recesses located on the outside of the bottom mold 122 as seen in FIG. 12C. The frit 123 is then reflow molded. A second reflowable substrate 124 is clamped between the top and bottom molds 121, 122 as seen in FIG. 12D. Referring to FIG. 12E, the substrate 124 is reflown towards the bottom of the bottom mold 122. During this step, the substrate 124 contacts and form fusion bonds with the frit material 123. In FIG. 12F, the reflown sample is detached from the molds. The microstructure that is fabricated using this process can be fabricated by aligning and bonding a shell and a solid piece that are molded separately. However, using that technique, it is impossible to align the shell and the solid piece perfectly accurately. The misalignment between the shell and solid pieces is highly undesirable, because it can lead to a differences in capacitance formed between these parts. The process described in FIG. 12 alleviates this problem. This is because the solid piece and the shell are self-aligned because both of them are molded from the same mold.

Figure 13A:
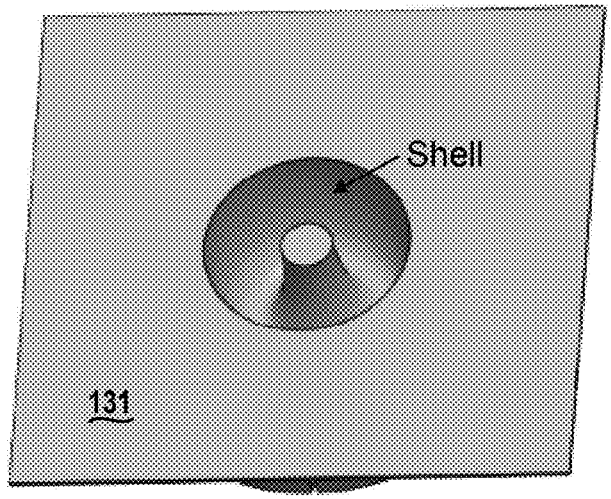
FIGS. 13A and 13B are a top view and a bottom view, respectively, of an example resonator.
Figure 13B:
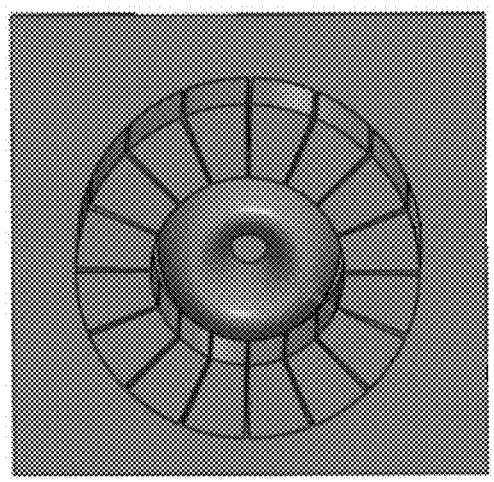

FIGS. 13A and 13B are the top and bottom views of an unreleased half toroidal shell surrounded by solid, toroidal electrodes that was fabricated using the method described in FIGS. 12A-12F. The hollow and solid regions of the structure are connected by a flat substrate 131. After the removal of the substrate 131 using grinding and polishing techniques, a vibratory rate-integrating gyroscope can be formed.

Figures 14A, 14B:
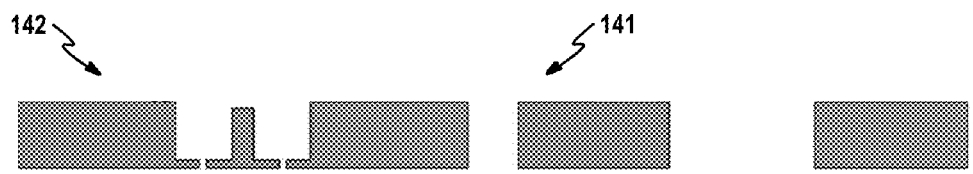
FIGS. 14A-14E are cross-sectional views illustrating process steps for reflow molding a stack of thermally reflowable layers.
Figure 14C:
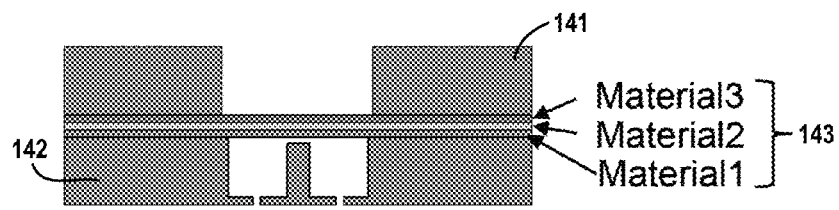
Figure 14D:
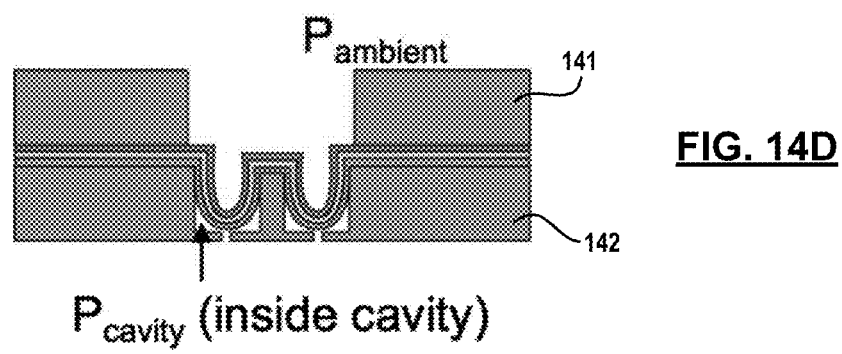
Figure 14E:
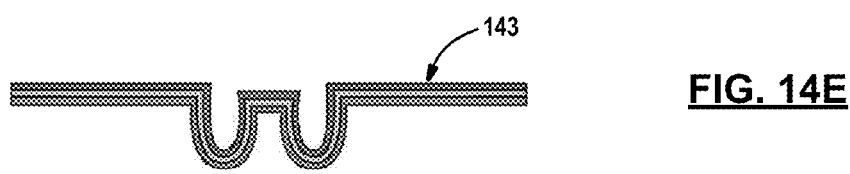

Stacks of different reflowable materials can also be used to create microstructures as shown in FIG. 14A-14E. The top and bottom molds 141, 142 are machined as seen in FIGS. 14A and 14B, respectively. A stack of thermally reflowable materials 143 are then clamped between two molds as seen in FIG. 14C. In this example, the stack of thermally reflowable materials 143 is comprised of three different materials: material 1, material 2 and material 3. The substrate is reverse blown toward the bottom mold as seen in FIG. 14D and then detached from the mold as seen in FIG. 14E. This method allows the co-fabrication of microstructure with a wide selection of physical properties (conductivity, piezoelectricity, piezoresistivity, etc.) with readout-and-control electrodes to form a variety of micro-scale sensors and actuators.

Figure 15A:
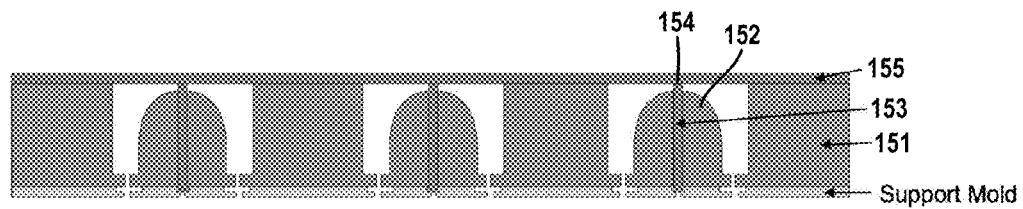
FIGS. 15A-15H are cross-sectional views illustrating the process steps for creating a rate-integrating gyroscope.

FIG. 15A-15H show the process for fabricating a rate-integrating gyroscope through wafer-level simultaneous micro reflow molding and welding, releasing, and assembly process. In FIG. 15A, a mold 151 is patterned into the shape of a dome 152, with a through hole 153 formed in the center of the dome, and a rod 154 that is longer than the depth of the through hole 153 is inserted and fixed in the hole 153. A substrate 155 comprised of reflow material is placed on the top surface of the mold 151.

Figure 15B:
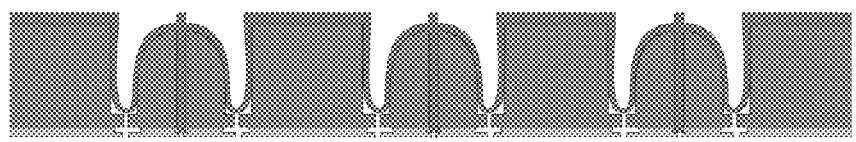

The substrate 155 is reshaped by heating the substrate above $T_M$ or $T_G$. A pressure gradient is applied concurrently across the substrate 155 to reflow the substrate 155 down toward the dome 152. The substrate 155 first touches and reflows around the rod 154. The substrate 155 then reflows around the dome as seen in FIG. 15B. The rod and the substrates are welded at that point. It should be noted that the rod can also have length equal or shorter than the depth of the cavity 153. This is because as the substrate 155 is reflown down toward the dome 152, the substrate can be reflown into the cavity 153 and be welded to the rod. Except for the differences described above, these fabrication steps are the same as that described in relation to FIGS. 6A-6E.

Figure 15C:
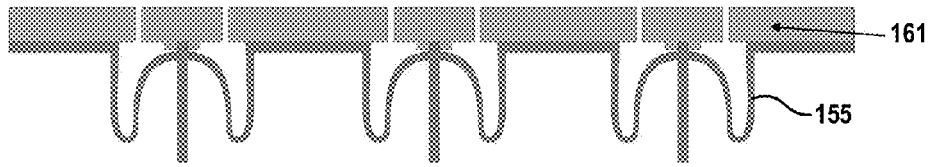
Figure 15D:
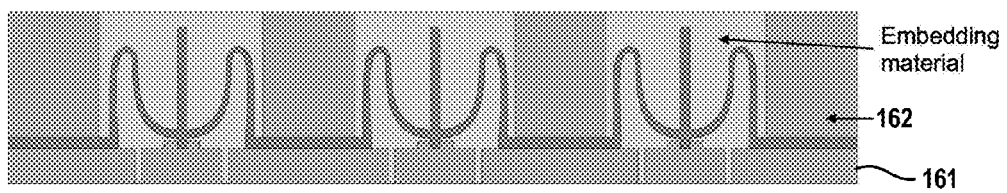
Figure 15E:
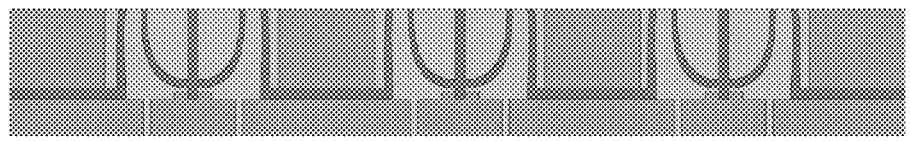
Figure 15F:
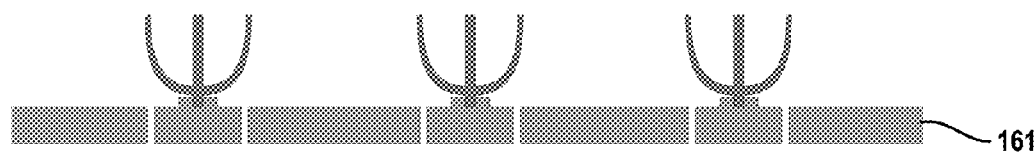

After separating from the mold, the reformed substrate 155 is transferred to and bonded to a carrier wafer 161 as seen in FIG. 15C. In FIG. 15D, the carrier wafer 161 is attached face up to a jig 162 and the reformed substrate 155 is embedded with a polymer or frit. Next, the jig 162 is ground and polished from the top to form the reflowed material in a bell shape. In FIG. 15F, the reformed material is cleaned and annealed, including dissolution of the polymer.

Figure 15G:
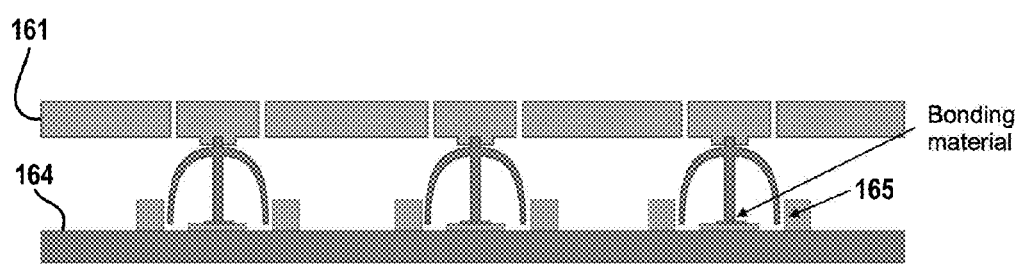
Figure 15H:
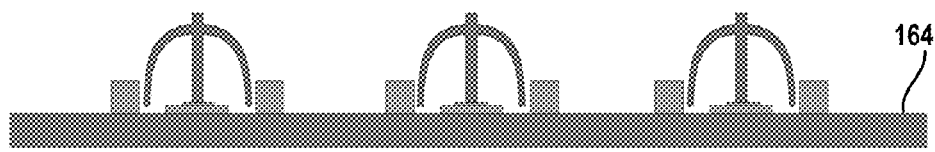

On a separate substrate 164, electrodes 165 are patterned using a combination of etching and electrode deposition process as seen in FIG. 15G. This substrate 164 is preferably made with same material as the reformed substrate 155 in order to match the thermal expansion coefficients to reduce the temperature sensitivity of the sensor. Each rod 154 is then align-bonded to the electrode substrate 164. If the reflowed material is an insulating material, the shells are coated with a thin layer of conducting metal using sputtering or atomic layer deposition processes. Lastly, the carrier substrate 161 is removed as seen in FIG. 17h.

This technique allows us to form complex microstructures consisting of shell and solid pieces. Strong fusion bonding between the shell and solid parts has very low energy loss at the bonding interface, which is critical for achieving high Q. The solid parts and the shell are self aligned, so very high alignment accuracy can be achieved. The materials that are bonded in the welding step (FIG. 15B) need not be the same material. Both thin shell and solid rod can have arbitrary shapes. The solid pieces can be located at arbitrary locations. Reflow molding can be done either upwards or downwards. It is also envisioned that the length of the rod 154 does not need to be longer than the depth of the recess.

Another important feature of the process shown in FIGS. 15A-15H is that the released shell in FIG. 15F has gradually increasing thickness profile from the rim to the rod. This thickness profile is created because, during the reflow molding step in FIG. 15B, the substrate 155 is stretched by increasing amounts (i.e. experiences increasing amounts of plastic deformation) as it is reflowed from the top (i.e., where the substrate and the rod are welded) to the bottom of the dome 152. This thickness profile is highly desirable, because the shells can withstand larger shock and can deform less under external vibrations (e.g. motors, engines, etc.) than the shells that have the opposite thickness profiles, such as the shells made using the processes shown in FIGS. 6 through 8. Also, the shells made using the steps shown in FIG. 15A-15H have lower anchor loss and higher Q than the shells having the opposite thickness profile. This is because, in the wineglass modes (i.e. flexural modes), the mechanical energy of the shell is concentrated around the rim by a greater amount than the shells that have the opposite thickness profile.

Figure 16A:
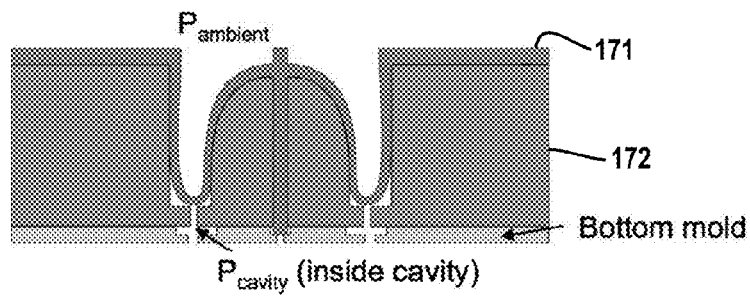
FIGS. 16A-16G are cross-sectional views illustrating a reflow molding process over a sacrificial layer to create narrow sensing and actuation gaps.
Figure 16B:
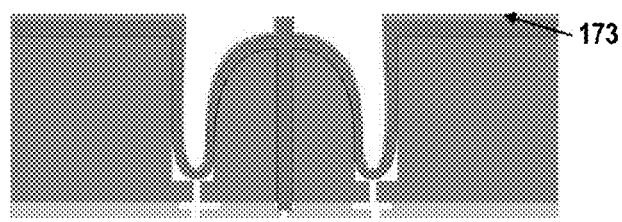
Figure 16C:
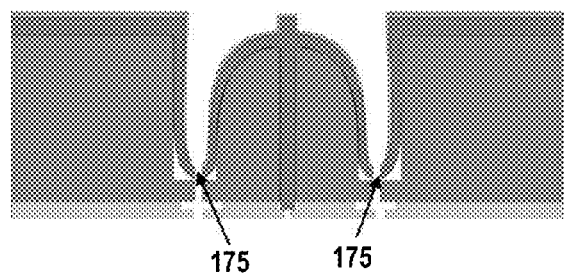

FIGS. 16A-16G show the fabrication steps for an example method that uses a thin sacrificial layer to form a narrow gap between a resonator and electrodes. In this example, a substrate of a reflowable material 171 is reflown on top of a mold 172 as seen in FIG. 16A. A thin sacrificial layer 173 is deposited on top of reflowed substrate 171 in FIG. 16B. Vacuum access holes 175 for controlling the pressure gradient during molding are created as seen in FIG. 16C.

Figure 16D:
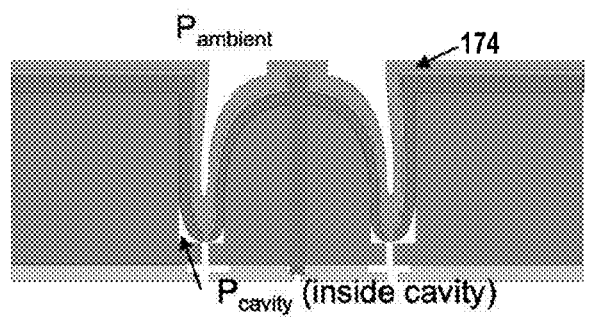
Figure 16E:
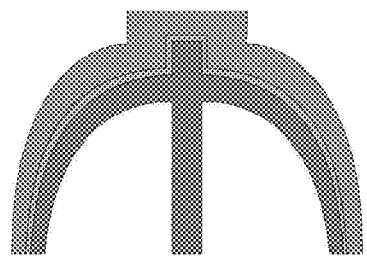
Figure 16F:
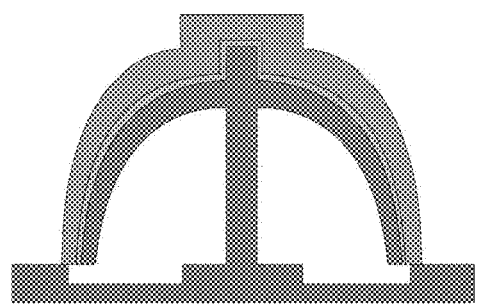
Figure 16G:
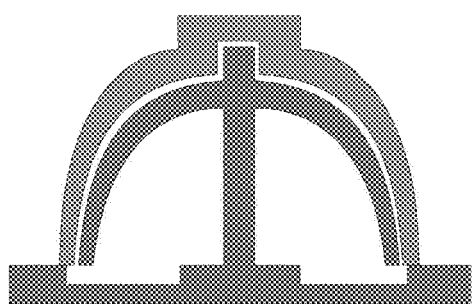

Another substrate of a reflowable material 174 is reflown on top of the sacrificial layer 173 in FIG. 16D. The combined microstructure is detached from the mold as seen in FIG. 16E and then is bonded to a support substrate 176 in FIG. 16F. Lastly, the sacrificial layer 173 is removed (e.g., by etching) in FIG. 16G. The reflowable material 174 can be optionally patterned to form multiple electrodes that will be used to drive and sense the motion of the shell. The narrow gap between the resonator and electrodes achieve increased sensing and actuating capacitances which thereby increase the sensing and actuating scale factor.

Figure 17A:
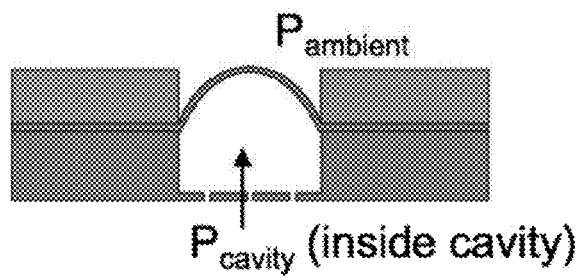
FIGS. 17A-17C are cross-sectional views illustrating process steps for creating through hole in a reflown shell.
Figure 17B:
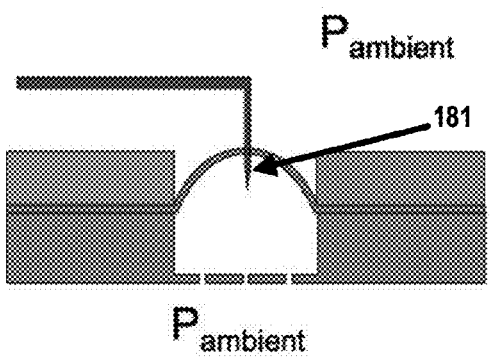
Figure 17C:
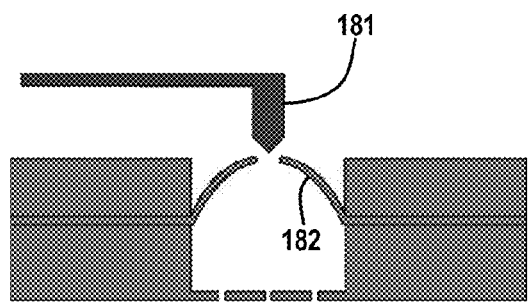

Once fabricated, the shapes of the different microstructures can be altered using micro tools. For example, the fabrication steps to create a through hole at the center of a reflown geometry is shown in FIG. 17A-17C. In this example, a micro needle 181 is inserted into the reflown sample 182 while it is hot, and it creates a hole through the shell as seen in FIG. 17B. In FIG. 17C, the needle 181 is removed from the blown sample 182 and the sample 182 is cooled down.

Figure 18A:
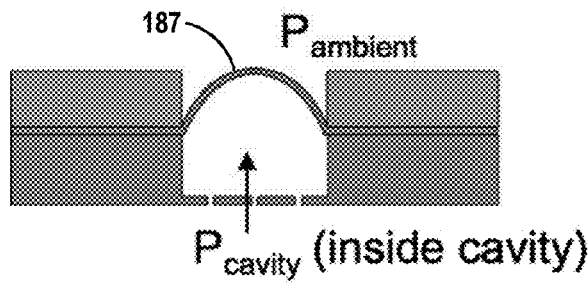
FIGS. 18A-18C are cross-sectional views illustrating process steps for inserting a tube in the middle of a reflown shell.
Figure 18B:
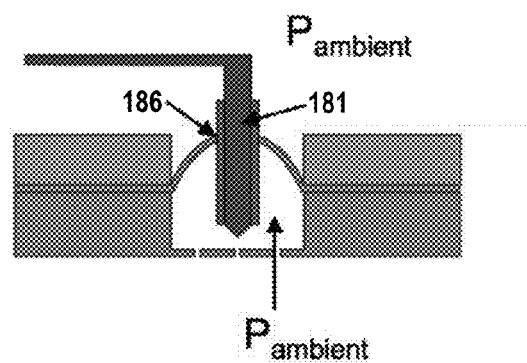
Figure 18C:
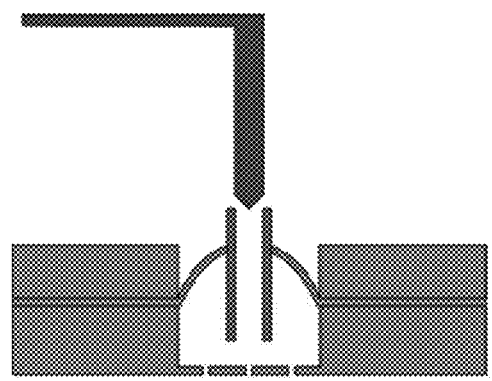

FIGS. 18A-18C shows another example of inserting a tube into a reflown shell 182. In FIG. 18A, a reflowable substrate 185 is reflown away from the bottom mold. A tube 186, carried by a micro needle 181, is inserted to the reflown shell 182 in FIG. 18B. The tube and the substrate can be welded at or above $T_M$ or $T_g$. The reflowable substrate 185 and the tube 186 fusion bond, and the micro needle 181 is removed from the shell 182 in FIG. 18C. These example are merely illustrative of the different techniques that can be used to alter the microstructures using micro tools. In addition, the types of materials for the tube and substrate need not be the same The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method for fabricating three-dimensional microstructures, comprising:
   disposing a substantially planar reflow material on a first mold having a recess formed therein, wherein the recess in the first mold defines a bottom surface and at least one side surface, and the at least one side surface includes a protrusion protruding into the recess, wherein the first mold further includes a pillar projecting upward from the bottom surface of the first mold, whereby the pillar shapes the reflow material;
   heating the reflow material while the reflow material is disposed on the first mold; and
   reflowing the reflow material towards the bottom surface of the first mold by creating a pressure gradient across the reflow material, whereby the protrusion in the at least one side surface helps to shape the reflow material and thereby form a three-dimensional microstructure.

2. The method of claim 1 further comprises controlling the pressure gradient across the reflow material independently from heating the reflow material.

3. The method claim 1 further comprises heating the reflow material using a heat source and creating a pressure gradient across the reflow material using a vacuum that differs from the heat source.

4. The method of claim 1 further comprises heating the reflow material above a glass transition temperature for a non-crystalline material or above melting temperature of the reflow material.

5. The method of claim 1 further comprises forming through holes in the bottom surface of the first mold and fluidly coupling the through holes to a pressure source.

6. The method of claim 1 further comprises detaching the reflown substantially planar reflow material from the first mold after the step of creating a pressure gradient across the reflow material.

7. The method of claim 1 wherein the reflow material is selected from a group consisting of fused silica, sapphire, ruby, silicon, glass and metal.

8. The method of claim 1 further comprises a second mold, wherein the reflow material is disposed between the first mold and the second mold.

9. A method for fabricating three-dimensional microstructures, comprising:
   disposing a substantially planar reflow material on a first mold having a recess formed therein, wherein the recess in the first mold defines a bottom surface and at least one side surface, and the at least one side surface includes a protrusion protruding into the recess;
   partitioning the recess in the first mold into two or more cavities and applying different pressures in one of the two or more cavities;
   heating the reflow material while the reflow material is disposed on the first mold; and
   reflowing the reflow material towards the bottom surface of the first mold by creating a pressure gradient across the reflow material, whereby the protrusion in the at least one side surface helps to shape the reflow material and thereby form a three-dimensional microstructure.

10. A method for fabricating three-dimensional microstructures, comprising:
   disposing a substantially planar reflow material on a first mold having a recess formed therein, wherein the recess in the first mold defines a bottom surface and at least one side surface, and the at least one side surface includes a protrusion protruding into the recess;
   heating the reflow material while the reflow material is disposed on the first mold; and
   reflowing the reflow material towards the bottom surface of the first mold by creating a pressure gradient across the reflow material, whereby the protrusion in the at least one side surface helps to shape the reflow material and thereby form a three-dimensional microstructure,
   wherein the first mold further includes one or more pockets formed in the at least one side surface of the first mold and fluidly coupling the one or more pockets via through holes to a pressure source, whereby the reflow material reflows laterally into the one or more pockets.

11. A method for fabricating three-dimensional microstructures, comprising:
   micromachining a first mold with a recess formed therein;
   micromachining a second mold with a recess formed therein, the recess of the second mold defining a bottom surface and at least one side surface, and the at least one side surface includes a protrusion protruding into the recess, wherein the second mold further includes a pillar projecting upward from the bottom surface of the second mold, whereby the pillar shapes the reflow material;
   disposing a substantially planar reflow material between the first mold and the second mold, such that the recess in the first mold faces the recess in the second mold and thereby forms a cavity;
   heating the reflow material while the reflow material is disposed between the first mold and the second mold; and
   creating a pressure gradient across the reflow material to reflow the reflow material towards the bottom surface of the second mold, wherein the pressure gradient is controlled independently from the heating of the reflow material.

12. The method claim 11 further comprises heating the reflow material using a heat source and creating a pressure gradient across the reflow material using a pressure source that differs from the heat source.

13. The method of claim 11 further comprises heating the reflow material above a glass transition temperature for a non-crystalline material or above melting temperature of the reflow material.

14. The method of claim 11 further comprises forming through holes in the bottom surface of the second mold and fluidly coupling the through holes to a pressure source.

15. The method of claim 11 further comprises detaching the reflown substantially planar reflow material from the first and second molds after the step of creating a pressure gradient across the reflow material.

16. The method of claim 11 further comprises partitioning the recess in the second mold into two or more cavities and applying different pressures in one of the two or more cavities.

17. A method for fabricating three-dimensional microstructures, comprising:
   micromachining a first mold with a recess formed therein;
   micromachining a second mold with a recess formed therein, the recess of the second mold defining a bottom surface and at least one side surface;
   disposing a substantially planar reflow material between the first mold and the second mold, such that the recess in the first mold faces the recess in the second mold and thereby forms a cavity;
   heating the reflow material while the reflow material is disposed between the first mold and the second mold; and
   creating a pressure gradient across the reflow material to reflow the reflow material towards the bottom surface of the second mold, wherein the pressure gradient is controlled independently from the heating of the reflow material,
   wherein the second mold further includes one or more pockets formed in the at least one side surface of the second mold and fluidly coupling the one or more pockets via through holes to a pressure source, whereby the reflow material reflows laterally into the one or more pockets.

* * * * *